(12) United States Patent
Korn

(10) Patent No.: US 6,424,221 B1
(45) Date of Patent: Jul. 23, 2002

(54) PROGRAMMABLE GAIN AMPLIFIER FOR USE IN DATA NETWORK

(75) Inventor: Thomas Korn, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/770,065

(22) Filed: Jan. 25, 2001

Related U.S. Application Data

(60) Provisional application No. 60/212,463, filed on Jun. 19, 2000.

(51) Int. Cl.[7] .................................................. H03G 3/12
(52) U.S. Cl. ......................................... 330/282; 330/86
(58) Field of Search .......................... 330/86, 282, 144, 330/284

(56) References Cited

U.S. PATENT DOCUMENTS

| | | | |
|---|---|---|---|
| 4,462,003 A | 7/1984 | Takamatsu | |
| 4,929,909 A | 5/1990 | Gilbert | |
| 5,077,541 A | 12/1991 | Gilbert | |
| 5,146,155 A | 9/1992 | Trinh et al. | |
| 5,194,822 A * | 3/1993 | Bureau et al. | 330/129 |
| 5,220,219 A | 6/1993 | Barber | |
| 5,245,229 A * | 9/1993 | Colvin, Sr. | 307/529 |
| 5,250,913 A | 10/1993 | Gleichert et al. | |
| 5,298,811 A | 3/1994 | Gilbert | |
| 5,345,185 A | 9/1994 | Gilbert | |
| 5,432,478 A | 7/1995 | Gilbert | |
| 5,489,868 A | 2/1996 | Gilbert | |
| 5,581,213 A * | 12/1996 | Linder et al. | 330/282 |
| 5,684,431 A | 11/1997 | Gilbert et al. | |
| 5,880,629 A | 3/1999 | Maeda | |
| 5,896,064 A | 4/1999 | Kaku | |
| 5,999,056 A | 12/1999 | Fong | |
| 6,069,899 A | 5/2000 | Foley | |
| 6,144,244 A | 11/2000 | Gilbert | |
| 6,226,322 B1 | 5/2001 | Mukherjee | |
| 6,229,397 B1 * | 5/2001 | Miura | 330/289 |

FOREIGN PATENT DOCUMENTS

EP  0 604 746 A2   7/1994

OTHER PUBLICATIONS

International Search Report for PCT Application No. PCT/US01/06393; Attorney docket No. E0846WO, International Filing Date Feb. 27, 2001; citing Patent Nos. US 6,226,322 (and JP 2000 036776); US 6,069,899A; US 5,146,155A; and EP 604,746 A.

Electronics Engineers'0 Handbook, 3$^{rd}$ Ed., Donald G. Fink and Donald Christanger, 1989,pp. 16–49 to 16–52.

* cited by examiner

Primary Examiner—Robert Pascal
Assistant Examiner—Henry Choe
(74) Attorney, Agent, or Firm—Renner, Otto, Boisselle & Sklar, LLP

(57) ABSTRACT

A data networking device having a variable gain amplifier with a first selectable impedance and a second selectable impedance for adjusting gain of the variable gain amplifier. The data networking device has an analog to digital converter for converting an analog output signal of the variable gain amplifier to a digital signal. The data networking device has a digital signal monitoring circuit for monitoring the digital signal and supplying feedback signals to actuate the first and second selectable impedances as a function of the digital signal, thereby adjusting the gain of the variable gain amplifier. A method of controlling a variable gain amplifier is also disclosed. An analog output signal of the variable gain amplifier is converted to a digital signal by an analog to digital converter. The method includes determining a portion of dynamic range of the analog to digital converter being used to convert the analog output signal of the variable gain amplifier. The method includes providing a first feedback signal to a first selectable impedance and providing a second feedback signal to a second selectable impedance, the first and second feedback signals adjusting the gain of the variable gain amplifier to increase the dynamic range used by the analog to digital converter.

21 Claims, 3 Drawing Sheets

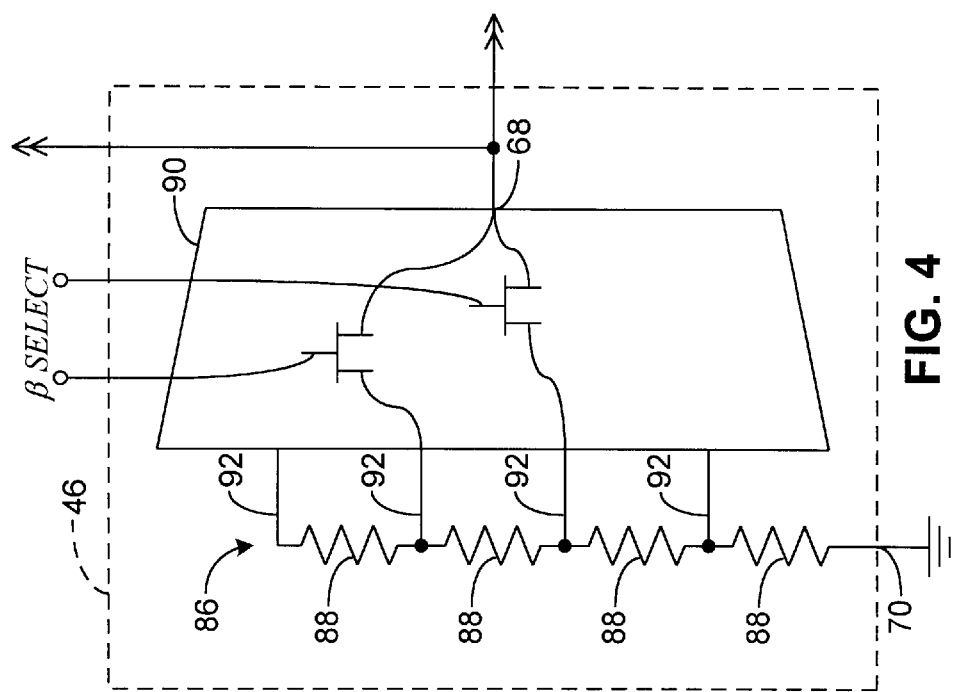
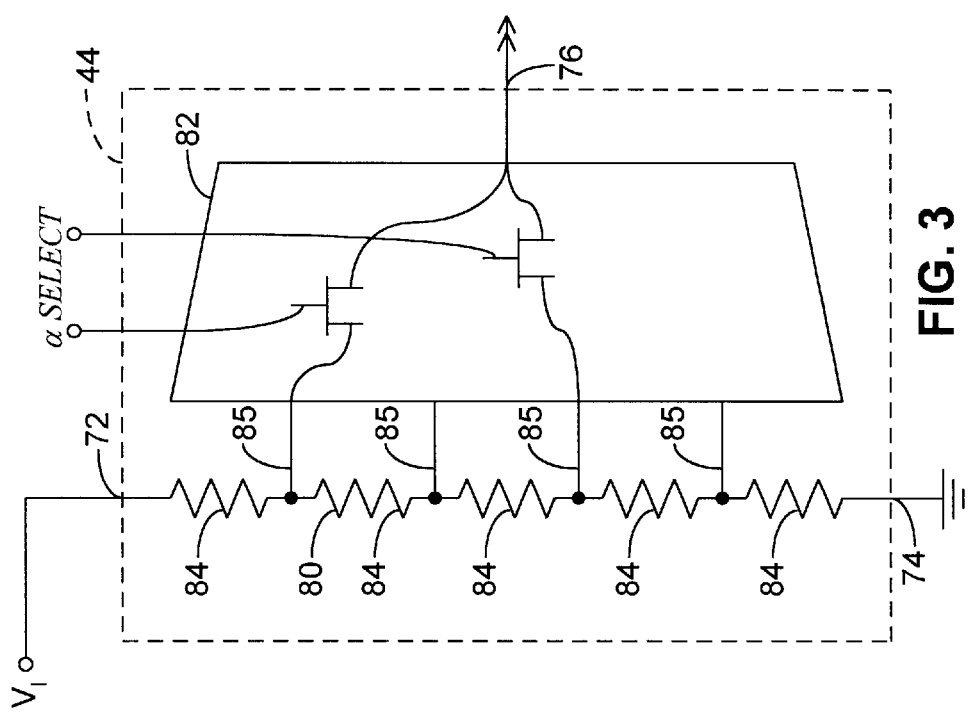

PROGRAMMABLE GAIN AMPLIFIER FOR USE IN DATA NETWORK

This application claims the benefit of U.S. Provisional application Ser. No. 60/212,463 filed Jun. 19, 2000.

TECHNICAL FIELD

The present invention generally relates to network interfacing and, more particularly, to a system for controlling transmission of data between the network stations connected to a network medium and a device and method for adjusting input gain.

BACKGROUND ART

There is an ever present demand for transmission of various types of data between computers. A predominate method of transmitting such data includes coding the data into a low frequency base data signal and modulating the base data signal onto a high frequency carrier signal. The high frequency carrier signal is then transmitted across a network cable medium, via RF signal, modulated illumination, or other network medium, to a remote computing station.

At the remote computing station, the high frequency carrier signal must be received and demodulated to recover the original base data signal. In the absence of any distortion of the carrier signal across the network medium, the received carrier would be identical in phase, amplitude, and frequency to the transmitted carrier and could be demodulated using known mixing techniques to recover the base data signal. The base data signal could then be recovered into digital data using known sampling algorithms.

However, the network topology tends to distort the high frequency carrier signal due to numerous branch connections and different lengths of such branches causing numerous reflections of the transmitted carrier. The high frequency carrier is further distorted by spurious noise caused by electrical devices operating in close proximity to the cable medium. Such problems are even more apparent in a network which uses home telephone wiring cables as the network cable medium because the numerous branches and connections are typically designed for transmission of plain old telephone system (POTS) signals in the 0.3 to 3.4 Kilohertz frequency and are not designed for transmission of high frequency carrier signals on the order of 1 Megahertz or higher. The high frequency carrier signals are further distorted by turn-on transients due to on-hook and off-hook noise pulses of the POTS utilizing the network cables.

Such distortion of frequency, amplitude, and phase of the high frequency carrier signal degrades network performance and tends to impede the design of higher rate networks and challenges designers to continually improve modulation techniques and data recovery techniques to improve data rates. For example, under the home phoneline networking alliance (HPNA) 1.0 standard, a 1 Mbit data rate is achieved using pulse position modulation (PPM) of a carrier, while the more recent HPNA 2.0 standard achieves a 10 Mbit data rate using a complex modulation scheme using a frequency diverse quadrature amplitude modulation (QAM). A problem exits in that a PPM modulated carrier signal and a QAM modulated carrier signal have significantly different power envelopes.

Another problem associated with advancing standards and increasing data rates is that, as in the HPNA example, original base data signal amplitude variations and distortions can cause an incoming analog signal to have an amplitude greater than the dynamic range of an analog to digital converter which converts the incoming analog signal into a digital representation of the incoming analog signal. The incoming analog signal can also have an amplitude which is less than the full dynamic range of the analog to digital converter, resulting in the failure to take advantage of the full dynamic range, or resolution, of the analog to digital converter.

Therefore, based on recognized industry goals for size and cost reductions, what is needed is a device and method for adjusting input gain for an amplifier in a receiver capable of receiving distorted, modulated carrier signals potentially using multiple modulation techniques.

SUMMARY OF THE INVENTION

The present invention provides a data networking device. The data networking device has a variable gain amplifier having a first selectable impedance and a second selectable impedance for adjusting gain of the variable gain amplifier. The data networking device has an analog to digital converter for converting an analog output signal of the variable gain amplifier to a digital signal. The data networking device has a digital signal monitoring circuit for monitoring the digital signal and supplying feedback signals to actuate the first and second selectable impedances as a function of the digital signal, thereby adjusting the gain of the variable gain amplifier.

According to another aspect of the invention, a method of controlling a variable gain amplifier is disclosed. An analog output signal of the variable gain amplifier is converted to a digital signal by an analog to digital converter. The method includes determining a portion of dynamic range of the analog to digital converter being used to convert the analog output signal of the variable gain amplifier. The method includes providing a first feedback signal to a first selectable impedance and providing a second feedback signal to a second selectable impedance, the first and second feedback signals adjusting the gain of the variable gain amplifier to increase the dynamic range used by the analog to digital converter.

BRIEF DESCRIPTION OF DRAWINGS

These and further features of the present invention will be apparent with reference to the following description and drawings, wherein:

FIG. 3 is a schematic diagram of a first selectable impedance for use with the variable gain amplifier according to the present invention.

FIG. 4 is a schematic diagram of a second selectable impedance for use with the variable gain amplifier according to the present invention.

DISCLOSURE OF INVENTION

Figure 1:
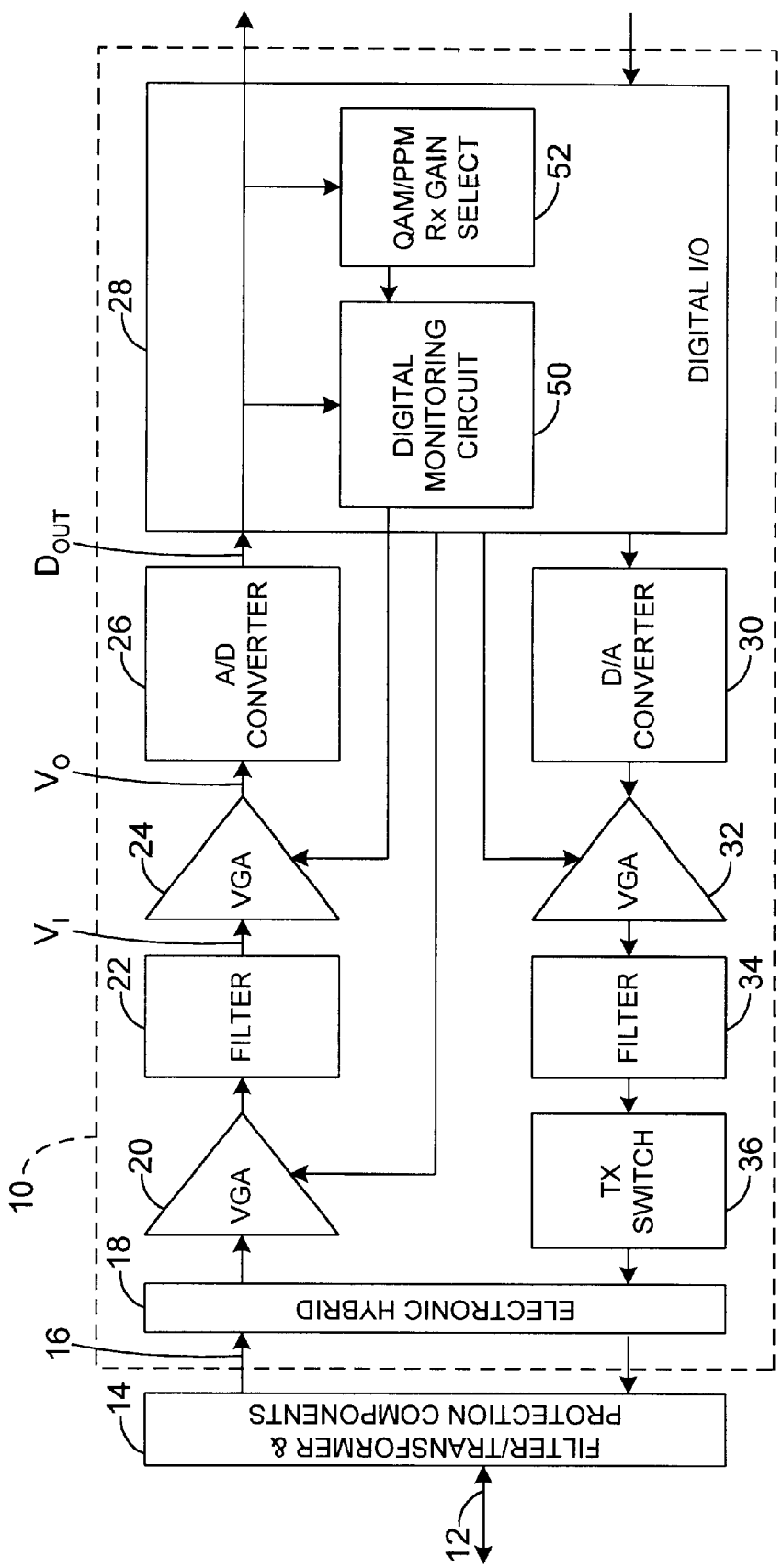
FIG. 1 is a block diagram of an analog front end circuit having a variable gain amplifier according to the present invention.

In the detailed description which follows, identical components have been given the same reference numerals, regardless of whether they are shown in different embodiments of the present invention. In order to clearly and concisely illustrate the present invention, the drawings may not necessarily be to scale and certain features may be shown in somewhat schematic form.

The present invention relates to a variable gain amplifier which conditions an incoming analog voltage signal to take advantage of the full dynamic range (i.e., resolution) of an analog to digital (A/D) converter in a data networking device.

FIG. 1 illustrates an analog front end circuit 10 of a networking device, such as a 1 Mbps, 10Mbps, 100 Mbps or other bandwidth home phoneline networking alliance (HPNA), or other standard, data network operating over a conventional POTS RJ11 telephone line 12. The analog front end circuit 10 receives data signals from the telephone line 12 via a circuit 14 having components to condition the data signals, such as filters, transformers, and surge protection. The received signals, or incoming analog voltage signals 16, are processed by an electronic hybrid circuit 18 to perform functions such as collision detection. Next, the incoming signals 16 are passed through a variable gain amplifier (VGA) 20 and a filter 22 to condition the incoming signals 16. The conditioned, incoming signals are input into another VGA 24 which amplifies the conditioned, received signals for an analog to digital (A/D) converter 26. The input signal to the VGA 24 will be referred herein as $V_I$ and the output of the VGA 24 will be referred to herein as $V_O$. The operation of the VGA 24 will be described in greater detail below. The A/D converter 26 converts the output of the VGA 24, or $V_O$, into a digital output, $D_{OUT}$. $D_{OUT}$ is then sent from the A/D converter 26 to a digital input/output (I/O) circuit 28. The digital I/O circuit 28 acts as an interface between the analog front end circuit 10 and a subsequent network device circuit.

Digital data output signals received from the subsequent network device circuit by the analog front end circuit 10 are received by the digital I/O circuit 28. The digital data output signals are converted into a transmit analog signal by a digital to analog (D/A) converter 30. The transmit analog signal is conditioned by another VGA 32. The VGA 32 acts as an adjustable gain transmit attenuater to allow for flexibility in setting the transmit power of the analog front end circuit 10. The attenuated signal is further conditioned by a filter 34. The filtered, attenuated transmit signal is optionally passed through a transmit switch 36 before being sent to the telephone line 12 through the electronic hybrid circuit 18 and the circuit 14.

One function of the I/O circuit 28 is to provide feedback signals to the VGA 20, the VGA 24 and the VGA 32. The feedback signals are used by VGAs 20, 24 and 32 to vary the gain of those amplifiers.

Figure 2:
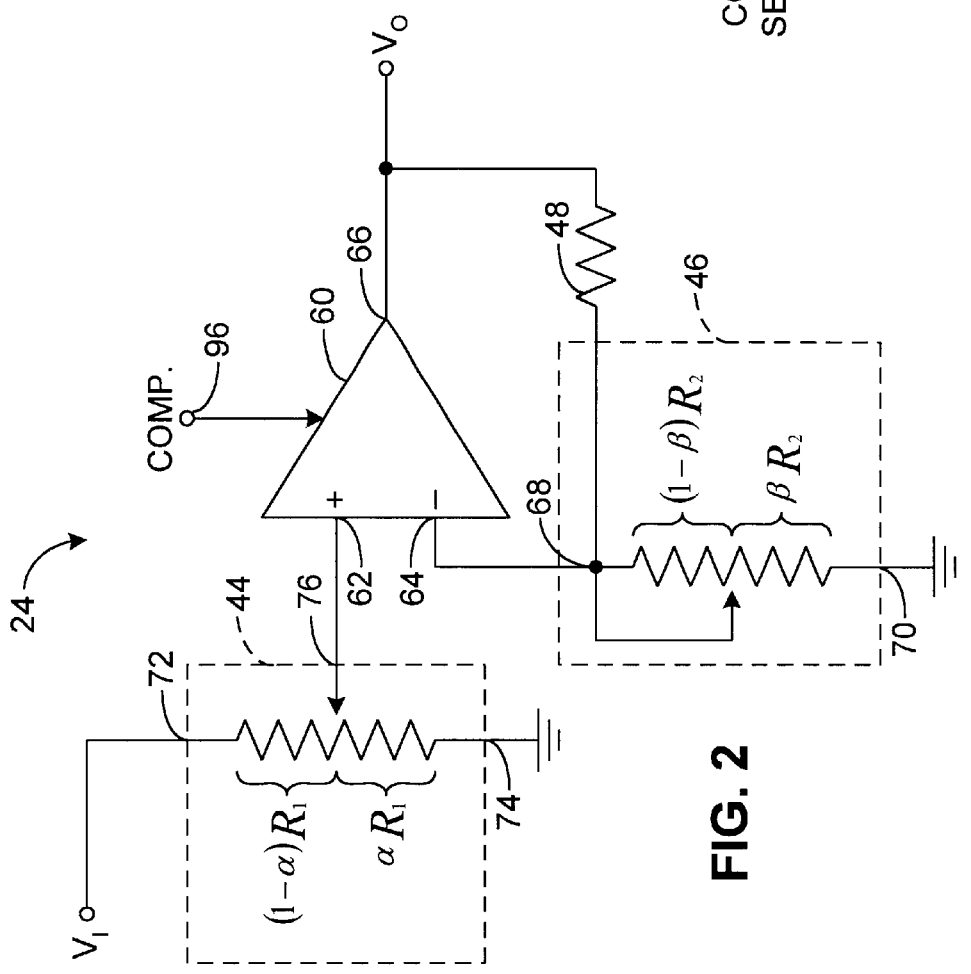
FIG. 2 is a representative circuit diagram of the variable gain amplifier according to the present invention.

With additional reference to FIG. 2, a schematic of the VGA 24 is illustrated. The VGA 24 is a programmable amplifier implemented in standards CMOS. The gain of the VGA 24 is adjusted by varying an input attenuater, or first selectable impedance 44, and a second selectable impedance 46 connected to a feedback impedance 48. As illustrated in FIG. 2, the first selectable impedance 44 and the second selectable impedance 46 are continuous potentiometers having total resistance values of $R_1$ and $R_2$ respectively. The potentiometers are one illustrative embodiment of the invention and one skilled in the art will appreciate that the selectable impedances 44, 46 can be implemented with discrete uniform or non-uniform tapped resistor ladders actuated with CMOS structures as illustrated in FIGS. 3 and 4 and as discussed in more detail below. Alternatively, the impedances 44, 46 can be implemented with other resistive or switching components giving equivalent results and are considered within the scope of the invention. The feedback impedance 48 has a fixed value, or $R_F$.

The first selectable impedance 44 and the second selectable impedance 46 are controlled by feedback from the digital I/O circuit 28. More specifically, the digital I/O circuit 28 has a digital monitoring circuit 50 providing feedback to the VGA 24. The digital monitoring circuit 50 monitors the digital output of the AID converter 26, or $D_{OUT}$. The digital monitoring circuit 50 collects information and statistics regarding the value of $D_{OUT}$ which are used to adjust the feedback provided to the VGA 24. The statistics and information include signal output levels of the A/D converter 26. If the output of the A/D converter 26 is consistently at or near the upper end of the dynamic range of the AID converter 26, $V_O$ may be saturating the A/D converter 26 and digital monitoring circuit 50 will provide feedback to the VGA 24 to attenuate $V_I$ or reduce the current gain setting of the VGA 24. On the other hand, if $D_{OUT}$ is consistently less than the full dynamic range of the A/D converter 26, the digital monitoring circuit will provide feedback to the VGA 24 to amplify $V_I$ to take advantage of the full dynamic range of the A/D converter 26. For example, if the digital output of the A/D converter 26 is consistently within the first 60% of the dynamic range of the A/D converter, the digital monitoring circuit 50 will provide feedback to the VGA 24 so that the gain of the VGA 24 is increased to amplify the signal provided to the A/D converter 26. The foregoing statistics and information about $D_{OUT}$ is collected by monitoring $D_{OUT}$'S average signal value and determining whether the average signal is within a certain dynamic range for a certain time period, such as 1.0 msec to 1.0 μsec. One skilled in the art will appreciate that other statistical and/or signal level sampling methods can be used and are considered to be within the scope of the present invention. As a more detailed example, the following table illustrates a sample gain determination look-up table. The factor to increase the gain by is selected conservatively so as not to overly increase the gain of the VGA 24 in a short period of time thereby saturating the A/D converter 26.

TABLE 1

| Monitored Dynamic Range of $D_{OUT}$: | Increase Gain by Factor of: |
|---|---|
| 0–40% | 2 to 2.5 |
| 40–50% | 1.75 to 2 |
| 50–60% | 1.5 to 1.66 |
| 60–70% | 1.3 to 1.43 |
| 75–80% | 1.2 to 1.25 |
| 80–85% | 1.15 to 1.18 |
| 85–90% | 1.08 to 1.11 |
| 90–95% | 1 to 1.05 |

The feedback signals produced by the digital monitoring circuit 50 can also be used to assist the analog front end circuit 10 recover signals that have been modulated using different standards, such as pulse position modulating (PPM) and frequency diverse quadrature amplitude modulation (QAM). Accordingly, the digital I/O circuit 28 is provided with a modulation detection and feedback circuit, or QAM/PPM $R_x$GAIN select circuit 52 (FIG. 1). The signal modulation type is detected by the QAM/PPM $R_x$GAIN select circuit 52 and a corresponding gain feedback signal for the modulation type ($R_x$GAIN) is produced to adjust the gain of the VGA 24 to coordinate with the power envelope of the modulation type. The gain feed back signal for the modulation type, $R_x$GAIN, is factored into the feedback signal produced by the digital monitoring circuit 50 used to determine if the full range of the A/D converter 26 is being utilized.

The QAM/PPM $R_X$GAIN select circuit 52 takes the digital samples from the A/D converter 26, or $D_{OUT}$, and processes the digital samples with a Hilbert transformer. Using known techniques, the Hilbert transformer separates an I channel signal, or I, and a Q channel signal, or G, from the digital samples. The I channel signal and the Q channel signal are input to an envelope detector which, utilizing known techniques, calculates the square root of the sum of $I^2+Q^2$ and generates an envelope signal representative thereof. The I channel signal and the Q channel signal are also coupled to an equalizer and slicer for recovering QAM modulated data, while the envelope signal is coupled to a decoder circuit for recovering PPM modulated data. The envelope signal is also coupled to each of a QAM automatic gain control (AGC) circuit and a PPM AGC circuit. The QAM AGC circuit functions to generate a QAM gain value (QAM RxGain) while the PPM AGC circuit functions to generate a PPM gain value (PPM RxGain). A multiplexer, controlled by a gain select signal, operates to select one of the QAM RxGain and the PPM RxGain signals. The selected gain signal, either QAM RxGain or PPM RxGain, from multiplexer is input to a the digital monitoring circuit 50 in either digital or analog form. The envelope signal is also input to a low pass filter for generating a filtered envelope signal which, in turn, is coupled to a carrier sense circuit for detecting the presence of a continuous carrier (e.g. QAM carrier) and generates the above-mentioned gain select signal to control the multiplexer.

With continued reference to FIG. 2, the VGA 24 is a current feedback amplifier having an amplifying component, or operational amplifier 60. The operational amplifier has a first input, or non-inverting input 62, to which $V_I$ is applied through the first selectable impedance 44. The operational amplifier 60 has a second input, or inverting input 64, connected to an output 66 of the operational amplifier 60 through the feedback impedance 48. The non-inverting input is also connected to a first terminal 68 of the second selectable impedance 46. A second terminal 70 of the second selectable impedance 46 is connected to a ground or other voltage reference. The input voltage to the VGA 24, or $V_I$, is connected to a first terminal 72 of the first selectable impedance 44. A second terminal 74 of the first selectable impedance 44 is connected to ground or other voltage reference. An output 76 of the first selectable impedance 44 is connected to the non-inverting input 62 of the operational amplifier 60. The output 66 of the operational amplifier 60 is connected to an input of the A/D converter 26.

As mentioned, the first selectable impedance 44 has a total resistance value of $R_1$. A first feedback signal, or signals, controls the first selectable impedance 44 such that a portion of $R_1$ is present between the second terminal 74 and the output 76 of the first selectable impedance 44. This portion of $R_1$, or $\alpha R_1$, represents a percentage of impedance connected between the second terminal 74 and the output 78. The balance of $R_1$, or $(1-\alpha)R_1$, represents the percentage of $R_1$ connected between the first terminal 72 and the output 76. A second feedback signal, or signals, controls the second selectable impedance 46 such that a portion of $R_1$ is present between the inverting input 64, or first terminal 68, and the second terminal 70. This portion of $R_2$, or $\beta R_2$, is the amount of impedance between the first terminal 68 and the second terminal 70. As one skilled in the art will appreciate, the gain of the VGA 24 can be expressed by the following equation.

$$\frac{V_O}{V_I} = \alpha \left( \frac{R_F}{\beta R_2} + 1 \right)$$

Referring to FIG. 3, an embodiment of the first selectable impedance 44 is illustrated in greater detail. The first selectable impedance 44 has a resistor ladder 80, or other type of voltage divider, and a multiplexer 82. The resistor ladder 80 has an overall impedance value of $R_1$ And is made up of a series of individual resistors 84. The multiplexer 82 selects which part of the resistor ladder 80 is connected between the first terminal 72 and the output 76, or $(1-\alpha)R_1$, thereby also determining the portion of the resistor ladder 80 connected between the second terminal 74 and the output 76, or $\alpha R_1$. The selection is made by coupling one of a series of taps 85 to the output 76. One skilled in the art will appreciate that the series of individual resistors 84 making up the resistor ladder 80 need not have the same impedance value. The impedance values of the resistors 84 can be the same, linearly related, or non-linearly related, such as logarithmically related. The number of individual resistors 84 and their impedance values can be adjusted to result in almost any transfer curve desired. In fact, the actual values of the individual resistors 84 is less important than the percentage of impedance above and below the selected tap 85 of the first selectable impedance 44.

The multiplexer 82 is controlled by one or more feedback lines from the digital monitoring circuit 50. The feedback lines are in the form of multiplexer select lines, or $\alpha$ select, used to control or actuate the multiplexer 82. The multiplexer 82 is a potential source of error for the VGA 24. Therefore, it is desirable to avoid creating a voltage drop across the switching mechanism of the multiplexer 82. Therefore, the switching mechanism of the multiplexer 82 is a series of MOS transistors controlled by the $\alpha$ select feedback lines from the digital monitoring circuit 50. The feedback signals, or $\alpha$ select, are digital signals to provide digital control of the VGA 24. NMOS and CMOS implementations of multiplexers which are adapted to receive digital select signals and multiplex, or couple, one of a plurality of taps, or inputs, to a single output are known in the art. Examples of such multiplexers are described in Donald G. Fink and Donald Christiansen, Electronics Engineers Handbook 3d. Ed., 1989, pgs. 16:49–53, incorporated herein by reference.

Referring to FIG. 4, the second selectable impedance is also provided with a resistor ladder 86 made up of a series of individual resistors 88, or other type of voltage divider, and a multiplexer 90 for coupling one of a series of taps 92 to the first terminal 68. Similar to the first selectable impedance 44, the second selectable impedance 46 receives feedback from the digital monitoring circuit 50 in the form of $\beta$ select lines to determine which portion of the resistor ladder 86 is connected between the first terminal 68 and the second terminal 70 of the second selectable impedance 46, or $\beta R_2$. The impedance values of the individual resistors 88 can be equal, linearly related or non-linearly related. It should be appreciated that the digital monitoring circuit 50 coordinates the $\alpha$ select and $\beta$ select feedback signals so that the first selectable impedance 44 and the second selectable impedance 46 can be individually or concurrently adjusted to provide the VGA 24 with the desired gain, attenuation or unity gain. The same type of MOS multiplexer used for the first selectable impedance 44 can be used in the second selectable impedance 46.

It is noted that by using a pair of selectable impedances 44, 46 controllable by the digital monitoring circuit 50 adjust the gain of the amplifier, a high degree of gain control is possible with a small number of individual resistors in the resistor ladders 80, 86. The digital monitoring circuit can be implemented with a microprocessor, comparator circuit or the like. The digital monitoring circuit is configured or programmed with predetermined α and β select feedback values to adjust the one or both of the selectable impedances 44, 46 to attain a desired gain of the VGA 24. For example, the digital monitoring circuit 50 can be provided with a memory for storing a look-up table with α and β select feedback values.

Figure 5:
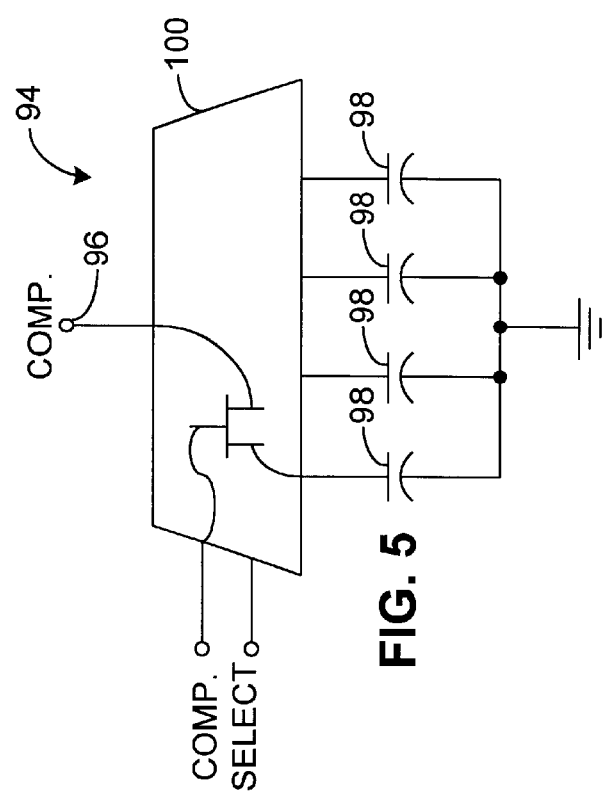
FIG. 5 is a schematic diagram of a selectable capacitive compensation circuit for use with the variable gain amplifier according to the present invention.

To provide stable amplification of the voltage signal $V_f$ at a constant bandwidth, the operational amplifier 60 of the VGA 24 is implemented as a current feedback amplifier to attain the benefits of constant bandwidth with closed loop gain. It is possible that the analog front end circuit will be used to communicate with other devices with more than one bandwidth. With this in mind, the VGA 24 can be adjusted with a selectable compensation capacitor network 94 (FIG. 5) coupled to the amplifier 60. The operational amplifier 60 is provided with a compensation note 96 (FIG. 2) which is connected to one of a plurality of capacitors 98 through a multiplexer 100. Each of the capacitors 98 has a different capacitance value which corresponds to an appropriate compensation for the amplifier 60 to provide closed loop gain at a selectable constant bandwidth. The multiplexer 100 is the same type of multiplexers 82, 90 used in the first and second selectable impedances 44, 46. The multiplexer 100 is controlled by compensation select feedback lines, or comp, select, controlled either by a bandwidth monitor in the digital monitoring circuit 50, the electronic hybrid circuit 18 or a separate bandwidth monitoring circuit connected to the receive side of the analog front end circuit 10. The selectable compensation capacitor network 94 and the variable gain capability of the VGA 24 allows the VGA 24 to provide an analog voltage signal to the A/D converter 26 which maximizes the dynamic range of the A/D converter 26 as the analog signal $V_f$ amplitude varies and as the bandwidth of the received signal varies.

Although particular embodiments of the invention have been described in detail, it is understood that the invention is not limited correspondingly in scope, but includes all changes, modifications and equivalents coming within the spirit and terms of the claims appended hereto.

What is claimed is:

1. A data networking device, comprising:
   a variable gain amplifier having a first selectable impedance and a second selectable impedance for adjusting gain of the variable gain amplifier;
   an analog to digital converter for converting an analog output signal of the variable gain amplifier to a digital signal; and
   a digital signal monitoring circuit for monitoring the digital signal and supplying feedback signals to actuate the first and second selectable impedances as a function of the digital signal, thereby adjusting the gain of the variable gain amplifier and wherein the digital monitoring circuit monitors the digital signal to determine the percentage of dynamic range of the analog to digital converter being used to convert the analog output signal of the variable gain amplifier.

2. The data networking device according to claim 1, wherein the first and second selectable impedances each have a resistor ladder and a multiplexer, the multiplexer tapping the resistor ladder based on the feedback signals.

3. The data networking device according to claim 2, wherein the multiplexer is implemented with MOS transistors and the feedback signals are digital select lines for actuating the multiplexers.

4. The data networking device according to claim 1, wherein the variable gain amplifier is provided with a capacitive compensation circuit for adjusting the bandwidth of the variable gain amplifier.

5. The data networking device according to claim 4, wherein the capacitive compensation circuit has a plurality of capacitors one of which being coupled to a compensation node of the variable gain amplifier with a multiplexer.

6. The data networking device according to claim 1, wherein the percentage of dynamic range is a function of the average signal value of the digital signal for a predetermined period of time.

7. The data networking device according to claim 1, wherein a signal modulation type is determined by a modulation detection and feedback circuit, the modulation detection and feedback circuit producing a modulation type gain feedback signal which is factored into the feedback signals to actuate the first and second selectable impedances.

8. The data networking device according to claim 1, wherein the variable gain amplifier is a current feedback operational amplifier.

9. The data network device according to claim 1, wherein the first selectable impedance has a resistor ladder having a first terminal connected to receive an analog voltage signal and a second terminal connected to a voltage reference, and a multiplexer for coupling an output of the first selectable impedance to a selected point on the resistor ladder, the output connected to a first input of an amplifier component, the feedback signals actuating the multiplexer to select a portion of the resistor ladder to be connected between the first terminal and the first amplifier input.

10. The data network device according to claim 1, wherein the second selectable impedance has a resistor ladder having a first terminal connected to an input of an amplifier component and a second terminal connected to a voltage reference, and a multiplexer for coupling the first terminal to a selected point on the resistor ladder, the feedback signals actuating the multiplexer to select a portion of the resistor ladder to be connected between the input of the amplifier component and the voltage reference.

11. The data network device according to claim 10, wherein the amplifier component has a feedback impedance connected between an output of the amplifier component and the input of the amplifier component.

12. The data network device according to claim 9, wherein the second selectable impedance has a resistor ladder having a first terminal connected to a second input of an amplifier component and a second terminal connected to a voltage reference, and a multiplexer for coupling the first terminal to a selected point on the resistor ladder, the feedback signal actuating the multiplexer to select a portion of the resistor ladder to be connected between the second input of the amplifier component and the voltage reference.

13. The data network device according to claim 12, wherein the amplifier component has a feedback impedance connected between an output of the amplifier component and the second input of the amplifier component.

14. A method of controlling a variable gain amplifier, an analog output signal of the variable gain amplifier being converted to a digital signal by an analog to digital converter, comprising the steps of:
   determining a portion of dynamic range of the analog to digital converter being used to convert the analog output signal of the variable gain amplifier; and
   providing a first feedback signal to a first selectable impedance and providing a second feedback signal to a second selectable impedance, the first and second feedback signals adjusting the gain of the variable gain amplifier to increase the dynamic range used by the analog to digital converter.

15. The method according to claim 14, wherein the portion of dynamic range used by the analog to digital converter is a function of the average signal value of the digital signal for a predetermined period of time.

16. The method according to claim 14, further comprising the step of selectively coupling a first input of an amplifier component of the variable gain amplifier to an input voltage signal through a portion of a resistor ladder in accordance with the first feedback signal.

17. The method according to claim 14, further comprising the step of selectively coupling a second input of an amplifier component of the variable gain amplifier to a voltage reference through a portion of a resistor ladder in accordance with the second feedback signal.

18. The method according to claim 16, further comprising the step of selectively coupling a second input of an amplifier component of the variable gain amplifier to a voltage reference through a portion of a resistor ladder in accordance with the second feedback signal.

19. The method according to claim 14, further comprising the steps of determining a modulation type of a receive signal, producing a modulation type gain feedback signal and factoring the modulation type gain feedback signal into the first and second feedback signals.

20. The method according to claim 14, wherein the first and second feedback signals are digital select signals for controlling multiplexers in the first and second selectable impedances.

21. The method according to claim 14, further comprising the steps of determining a bandwidth of a receive signal and providing a feedback signal to a couple one of a series of compensation capacitors to a compensation node of the variable gain amplifier.

* * * * *